United States Patent [19]
Ramamurthy et al.

[11] Patent Number: 6,158,034
[45] Date of Patent: Dec. 5, 2000

[54] BOUNDARY SCAN METHOD FOR TERMINATING OR MODIFYING INTEGRATED CIRCUIT OPERATING MODES

[75] Inventors: Srinivas Ramamurthy, San Jose, Calif.; James Fahey, Aix En Provence, France; Eugene Jinglun Tam, San Jose; Geoffrey S. Gongwer, Campbell, both of Calif.

[73] Assignee: Atmel Corporation, San Jose, Calif.

[21] Appl. No.: 09/205,651

[22] Filed: Dec. 3, 1998

(Under 37 CFR 1.47)

[51] Int. Cl.$^7$ .................................................. G01R 31/28
[52] U.S. Cl. .............................................................. 714/727
[58] Field of Search ................................... 714/727, 733, 714/735, 736, 729

[56] References Cited

U.S. PATENT DOCUMENTS

| | | | |
|---|---|---|---|
| 5,404,358 | 4/1995 | Russell | 371/22.3 |
| 5,448,576 | 9/1995 | Russell | 371/22.3 |
| 5,459,737 | 10/1995 | Andrews | 371/22.5 |
| 5,495,487 | 2/1996 | Whetsel, Jr. | 371/25.1 |
| 5,528,610 | 6/1996 | Edler et al. | 371/22.3 |

OTHER PUBLICATIONS

IEEE Std 1149.1–1990 (Includes IEEE Std 1149.1a–1993), published by the Institute of Electrical and Electronics Engineers, Inc., Oct. 21, 1993.

*Primary Examiner*—Albert De Cady
*Assistant Examiner*—Samuel Lin
*Attorney, Agent, or Firm*—Thomas Schneck; John P. McGuire, Jr.

[57] ABSTRACT

A JTAG Boundary Scan method by which the on-chip system logic (OCSL) of an integrated circuit is changed by use of a state machine which, among other functions, allows a predefined set of instructions to be loaded into an Instruction Register and then executed. The predefined instructions are designed to follow in sequence after certain other previous instructions. The instructions change the OCSL from one state to another state and allows the state to be changed without the need of a full device reset. Additional instructions within this invention were created to have attendant operating modes for which termination is self timed within the integrated circuit. Additional instructions further control the implementation of instruction execution within the state machine.

10 Claims, 6 Drawing Sheets

STARTOP-STOPOP INSTRUCTION SEQUENCE

501) TEST-LOGIC-RESET
502) RUN-TEST-IDLE
503) SELECT-DR-SCAN
504) SELECT-IR-SCAN
505) CAPTURE-IR
506) SHIFT-IR; REPEAT FOR N CYCLES, N= IR LENGTH
   (INSTRUCTION = STARTOP)
507) EXIT 1-IR
508) UPDATE-IR         ⟩ 80
509) SELECT-DR-SCAN
510) SELECT-IR-SCAN
511) CAPTURE-IR
512) SHIFT-IR; REPEAT FOR N CYCLES, N= IR LENGTH
   (INSTRUCTION = STOPOP)
513) EXIT 1-IR
514) UPDATE-IR         ⟩ 89

SAMPLE/PRELOAD INSTRUCTION SEQUENCE

401) TEST-LOGIC-RESET
402) RUN-TEST-IDLE
403) SELECT-DR-SCAN
404) SELECT-IR-SCAN
405) CAPTURE-IR
406) SHIFT-IR; REPEAT FOR N CYCLE, N= DEVICE CHAIN TOTAL IR LENGTH
(INSTRUCTION = IDCODE)
407) EXIT 1-IR
408) UPDATE-IR
409) SELECT-DR-SCAN
410) CAPTURE-DR
411) SHIFT-DR;REPEAT FOR M CYCLES,M=
DEVICE CHAIN TOTAL DEVICE ID REGISTER LENGTH
(DEVICE ID APPEARS ON TDO PIN)
412) EXIT 1-DR
413) UPDATE-DR
414) SELECT-DR-SCAN
415) SELECT-IR-SCAN
416) CAPTURE-IR
417) SHIFT-IR; REPEAT FOR N CYCLES, N = IR LENGTH
(INSTRUCTION = SAMPLE/PRELOAD)
418) EXIT 1-IR
419) UPDATE-IR
420) SELECT-DR-SCAN
421) CAPTURE-DR
(PERFORMS BSR DATA SAMPLING)
422) SHIFT-DR; REPEAT FOR K CYCLES, K = TDR LENGTH
**(SAMPLED BSR DATA APPEARS ON TDO;
PRELOAD DATA MAY BE SIMULTANEOUSLY
SHIFTED INTO THE BSR USING TDI PIN)**
423) EXIT 1-DR
424) UPDATE-DR

*Fig.* 4 (Prior Art)

STARTOP-STOPOP INSTRUCTION SEQUENCE

501) TEST-LOGIC-RESET
502) RUN-TEST-IDLE
503) SELECT-DR-SCAN
504) SELECT-IR-SCAN
505) CAPTURE-IR
506) SHIFT-IR; REPEAT FOR N CYCLES, N= IR LENGTH
(INSTRUCTION = STARTOP)
507) EXIT 1-IR
508) UPDATE-IR                  ⸺80
509) SELECT-DR-SCAN
510) SELECT-IR-SCAN
511) CAPTURE-IR
512) SHIFT-IR; REPEAT FOR N CYCLES, N= IR LENGTH
(INSTRUCTION = STOPOP)
513) EXIT 1-IR
514) UPDATE-IR                  ⸺89

*Fig.* 5

ALTERNATE STARTOP-STOPOP INSTRUCTION SEQUENCE; TDR SAMPLE DURING STARTOP

601) TEST-LOGIC-RESET
602) RUN-TEST-IDLE
603) SELECT-DR-SCAN
604) SELECT-IR-SCAN
605) CAPTURE-IR
606) SHIFT-IR; REPEAT FOR N CYCLES, N= IR LENGTH
(INSTRUCTION = STARTOP)
607) EXIT1 - IR
608) UPDATE-IR                  ⸺80
609) SELECT-DR-SCAN
610) CAPTURE-DR
(SAMPLES TDR INPUTS)
611) SHIFT-DR; REPEAT FOR M CYCLES, M= TDR REGISTER LENGTH
(STARTOP RESULTS APPEAR ON TDO PIN)
612) EXIT 1-DR
613) UPDATE-DR
614) SELECT-DR-SCAN
615) SELECT-IR-SCAN
616) CAPTURE-IR
617) SHIFT-IR; REPEAT FOR N CYCLES, N= IR LENGTH
618) EXIT 1-IR
619) UPDATE-IR

*Fig.* 6

ALTERNATE STARTOP- STOPOP INSTRUCTION SEQUENCE; TDR SAMPLE DURING STOPOP

701) TEST-LOGIC-RESET
702) RUN-TEST-IDLE
703) SELECT-DR-SCAN
704) SELECT-IR-SCAN
705) CAPTURE-IR
706) SHIFT-IR; REPEAT FOR N CYCLES, N= IR LENGTH
(INSTRUCTION = STARTOP)
707) EXIT 1-IR
708) UPDATE-IR
709) SELECT-DR-SCAN
710) SELECT-IR-SCAN
711) CAPTURE-IR
712) SHIFT-IR; REPEAT FOR N CYCLES, N= IR LENGTH
(INSTRUCTION = STARTOP)
713) EXIT-IR
714) UPDATE-IR ⟵ 89
715) CAPTURE-DR
(SAMPLES TDR INPUTS)
716) SHIFT-DR; REPEAT FOR M CYCLES, M= TDR REGISTER LENGTH
(STOPOP RESULTS APPEAR ON TDO PIN)

*Fig. 7*

SELFTIMEDOP INSTRUCTION SEQUENCE

801) TEST-LOGIC-RESET
802) RUN-TEST-IDLE
803) SELECT-DR-SCAN
804) SELECT-IR-SCAN
805) CAPTURE-IR
806) SHIFT-IR; REPEAT FOR N CYCLES, N= IR LENGTH
(INSTRUCTION = SELFTIMEDOP)
807) EXIT 1-IR ⟵ 82
808) UPDATE-DR
(EXECUTION BEGINS; EXECUTION TERMINATES AFTER SELF-TIMED DURATION)

*Fig. 8*

STARTOP EXECUTION TERMINATED AT RUN-TEST-IDLE STATE

901) TEST-LOGIC-RESET
902) RUN-TEST-IDLE
903) SELECT-DR-SCAN
904) SELECT-IR-SCAN
905) CAPTURE-IR
906) SHIFT-IR; REPEAT FOR N CYCLES, N= IR LENGTH
(INSTRUCTION - STARTOP)
907) EXIT 1-IR
908) UPDATE-IR
909) RUN-TEST-IDLE — 84
(EXECUTION TERMINATES)

*Fig.* 9

STARTOP- MODOP INSTRUCTION SEQUENCE

551) TEST-LOGIC-RESET
552) RUN-TEST-IDLE
553) SELECT-DR-SCAN
554) SELECT-IR-SCAN
555) CAPTURE-IR
556) SHIFT-IR; REPEAT FOR N CYCLES, N= IR LENGTH
(INSTRUCTION = STARTOP)
557) EXIT 1-IR
558) UPDATE-IR
559) SELECT-DR-SCAN
560) SELECT-IR-SCAN
561) CAPTURE-IR
562) SHIFT-IR; REPEAT FOR N CYCLES, N= IR LENGTH
(INSTRUCTION = MODOP)
563) EXIT 1-IR
564) UPDATE-IR

*Fig.* 10

BOUNDARY SCAN METHOD FOR TERMINATING OR MODIFYING INTEGRATED CIRCUIT OPERATING MODES

TECHNICAL FIELD

The invention relates to integrated circuit testing and, in particular, to integrated circuit testing by a Boundary Scan system.

BACKGROUND ART

IEEE/ANSI standard 1149.1 - 1990, also known as JTAG and Boundary Scan, is a standard for testing integrated circuits as well as circuit boards. In the prior art, printed circuit boards were tested by automatic test equipment (ATE) which contacted special locations on a board by means of probe wires attached to a probe card. The probe card interfaced with the ATE in a manner such that test signals could be sent to and from the ATE to specific areas of a board under test. On the other hand, Boundary Scan requires that certain registers and dedicated pins be placed on a chip so that software can be used to implement test procedures, rather than ATE. Relatively inexpensive computers can now be used to test integrated circuit chips even after the chip is manufactured and shipped. Five dedicated pins provided on chips with a Boundary Scan test capability communicate with a Test Access Port (TAP) which gives access to logic which executes Boundary Scan and other test procedures. The pins are Test Data In (TDI), Test Data Out (TDO), Test Clock (TCK), Test Mode Select (TMS) and Test Reset (TRST).

Three of the five dedicated pins, namely TMS, TCK and TRST, access a simple state machine, with 16 states, known as the TAP Controller. In turn, the TAP Controller, together with dedicated pins TDI and TDO communicate with an Instruction Register, as well as with two other registers which are mandatory in any Boundary Scan implementation. These are the Boundary Scan Register and the Bypass Register. The Instruction Register, in turn, communicates with other registers, known generally as Data Registers, some of which may be user-defined. The Data Registers allow for device configuration, verification, test, reliability evaluation and so on. One further important feature of Boundary Scan architecture is a set of test cells, one cell being associated with each of the functional input/output pins of the integrated circuit so that a cell may be used as an input or output cell for the device. The cells are arranged in a shift-register organization for serial communication between the TDI and TDO pins.

The JTAG standard has two major modes of operation, non-invasive mode and pin-permission mode. The standard specifies a set of circuitry guaranteed to be independent of the rest of the logic within an integrated circuit (IC). The logic circuitry within an IC excluding the JTAG circuitry is defined as the on-chip system logic (OCSL). In non-invasive mode, the JTAG circuitry is used to communicate asynchronously with the outside world to set up tests or to read out results. These activities do not affect the normal behavior of the IC. In pin-permission mode, the JTAG standard specifies instruction modes of operation that can take over control of input/output (I/O) pins of the IC, effectively disconnecting the OCSL from the outside world. These modes allow the testing of the OCSL or its isolation from testing activities taking place at its pins. Among the pin-permission instructions taught are INTEST, EXTEST and RUNBIST. The INTEST instruction allows the Boundary Scan Register to apply stimulus to and to capture test results from the OCSL of the device. The EXTEST instruction allows the Boundary Scan Register to apply stimulus to and capture test results from board level connections between integrated circuits. The RUNBIST instruction is similar to the INTEST instruction, except that it may target any designer specified register between pins TDI and TDO (which may or may not include the Boundary Scan Register).

After certain JTAG operations, the devices OCSL may need to be reset in order to return to normal operation. Among these operations are RUNBIST, INTEST, EXTEST, CLAMP and HIGHZ. An OCSL reset may also be required after executing design-specific, non-standard instructions.

In an integrated circuit using the JTAG test methodology, a device reset would normally be performed either by (1) asserting a TRST pin, which loads the BYPASS or IDCODE instruction into the Instruction Register, or (2) removing, then re-applying device power, or (3) removing a compliance-enable data pattern from a set of compliance-enable pins, or (4) traversing the Test Access Port controller to the Test-Logic-Reset state. Each of these actions sets the TAP controller to the Test-Logic-Reset state, and configures the test logic such that it does not affect OCSL operation. Each of these procedures also loads the Instruction Register with the BYPASS (or, if it exists, the IDCODE) instruction code.

The Instruction Register content may also be changed by traversing the TAP controller through the Update-IR state. In fact, this is the only method that the JTAG specification provides for changing the Instruction Register content to anything other than the BYPASS (or IDCODE) instruction. Therefore, this is the only method taught by which the instruction may be changed without configuring the test logic such that it does not affect OCSL operation.

Within the present JTAG test logic structure, there are operations where the OCSL's operation may need to be controlled such that the OCSL cannot be damaged. Among these operations are the execution of the EXTEST, CLAMP and HIGHZ instructions. The JTAG specification states that such control, if required, must occur while the specific instruction is selected. Also, other instructions may require different alterations to the OCSL's operation. For example, while the INTEST instruction is selected, the OCSL must be capable of a single step clocking operation (IEEE 1149.1a 7.8.1.c).

Table A shows the minimum set of instructions that must be included within an IC in order for the IC to be compliant with the JTAG specifications. Only the BYPASS, EXTEST and SAMPLE/PRELOAD instructions are required by the IEEE 1149.1 specification.

TABLE A

Minimum JTAG instruction set. PRIOR ART

| Instruction Name | Register | IR Code |
| --- | --- | --- |
| Extest | Boundary Scan | 00 |
| Sample/Preload | Boundary Scan | 01 or 10 |
| Bypass | Bypass | 11 |

Table B lists an expanded set of standardized JTAG instructions described by the specification. The additional instructions beyond those included in Table A are described in the JTAG specification in order to standardize the instructions operation.

TABLE B

Full standard JTAG instruction set. PRIOR ART

| Instruction Name | Register | IR Code |
| --- | --- | --- |
| Extest | Boundary Scan | 0000 |
| Sample/Preload | Boundary Scan | 0001 |
| Intest | Boundary Scan | 0010 |
| Bypass | Bypass | 1111 |
| Clamp | Bypass | 0011 |
| HighZ | Bypass | 0100 |
| Idcode | Device ID | 0101 |
| Usercode | Device ID | 0110 |
| Runbist | Test Data or Boundary Scan | 0111 |

FIG. 4 lists an example flow diagram of the operation sequences required to transition between standardized instructions. FIG. 4 lists a typical operation sequence for an IDCODE instruction followed by a SAMPLE/PRELOAD instruction. This particular sequence is commonly performed upon initial power-up of a circuit board that has been designed to use the JTAG interface for board testing.

In FIG. 4, the IDCODE instruction is first executed to ensure that the proper devices are in place on the board. In step 411, the devices identifying codes are shifted out on their TDO pins. The controlling test system compares these code values against the set of expected values. If all of the values match, then all devices are known to be in place, and the JTAG serial data chain is known to be operating correctly. The SAMPLE/PRELOAD instruction may then be used to determine whether the device's OCSL has powered up correctly, and to load data for subsequent test operation. In FIG. 4, step 421, the devices capture initial values presented to their boundary scan register (BSR) cells. In step 422, this initial capture data is shifted out for inspection. At the same time, PRELOAD data is typically shifted into the device's BSR's in preparation for a subsequent EXTEST, INTEST or RUNBIST instruction. Alternatively, steps 406 through 408 may be omitted, since the JTAG specification requires that the IDCODE instruction be loaded into the instruction register whenever a device's TAP controller is in the Test-Logic-Reset state.

In many cases of sequential JTAG instruction execution, there is no dependence between the operations. For example, in FIG. 4, the SAMPLE/PRELOAD operation is in no way dependent upon selection or execution of the previous IDCODE operation. The exceptions to this instruction independence are the execution of a SAMPLE/PRELOAD instruction followed by an EXTEST or INTEST instruction. In these cases, the PRELOAD portion of the SAMPLE/PRELOAD instruction loads data into the BSR. The following EXTEST OR INTEST operation relies on this BSR data to perform a test of either the board level interconnect or of the OCSL operation. However, even in these cases, the OCSL's operation is specifically not altered by the initial SAMPLE/PRELOAD operation. The SAMPLE/PRELOAD instruction serves only to initialize the BSR data for use by the subsequent EXTEST or INTEST instruction. This instruction dependence also applies to a SAMPLE/PRELOAD instruction preceding or following a RUNBIST instruction, if the RUNBIST instruction is designed to utilize the BSR.

It is an object of the invention to extend the functionality and flexibility of the JTAG test logic structure and methodology by defining and including instructions that operate in sequence, such that one instruction is designed and intended to be executed in sequence after one or more preceding instructions, where the preceding instructions modify the operation of the OCSL. It is another object of the invention to devise a methodology by which the OCSL operating mode of the device may be changed by use of state machine and Instruction Register control, with instructions that provide alternate methods for terminating or altering operation initiated by previously executed instructions.

SUMMARY OF THE INVENTION

The above objects have been met with a Boundary Scan method by which the OCSL's status is changed by use of a state machine which, among other functions, allows loading of instructions into an Instruction Register. Specifically, the state machine allows a predefined set of instructions to be individually loaded and executed. At least some of the defined instructions are specifically designed to follow in sequence after certain other previous instructions. The initial instruction in the sequence changes the OCSL from a first condition to a second condition. Subsequent instruction execution again changes the OCSL condition. In some cases, the OCSL condition is changed back to the first condition. In other cases, the OCSL condition is changed to a third condition.

In order to achieve this result, instructions are added to a minimum set of JTAG instructions. Addition of these instructions can be implemented within the structure of the JTAG test logic circuitry. Changes need only be evident in the addition of new operating instructions and new or modified OCSL control (and possibly modified Boundary Scan Register and/or Test Data Register Control) from the Instruction Register decoder.

Another part of this invention is the creation of instructions and attendant operating modes for which termination is self-timed within the integrated circuit. Alternatively, for any of the new instructions described in this invention, instruction execution may be designed to begin or end only after the instruction is updated to the new instruction and the state machine has traversed to some other predefined state or set of states. (The state or set of states may be defined at least partially by electrically configured data within the device and/or by the signal levels on external device pins.) Further, instruction execution may be designed to being or end on a state machine clock edge that does not produce a state transition.

BRIEF DESCRIPTION OF THE DRAWINGS

FIG. 4 is a flow diagram of an IDCODE-SAMPLE/PRELOAD instruction sequence, known in the prior art.

FIG. 5 is a flow diagram of a STARTOP-STOPOP instruction sequence of the present invention.

FIG. 6 is a flow diagram of an alternate STARTOP-STOPOP instruction sequence, Test Data Register sample during STARTOP in accord with the present invention.

FIG. 7 is a flow diagram of an alternate STARTOP-STOPOP instruction sequence, Test Data Register sample during STOPOP in accord with the present invention.

FIG. 8 is a flow diagram of a SELFTIMEDOP instruction sequence in accord with the present invention.

FIG. 9 is a flow diagram of an instruction sequence where STARTOP execution is terminated at the RUN-TEST-IDLE state in accord with the present invention.

FIG. 10 is a flow diagram of a STARTOP-MODOP instruction sequence of the present invention.

BEST MODE FOR CARRYING OUT THE INVENTION

Figure 1:
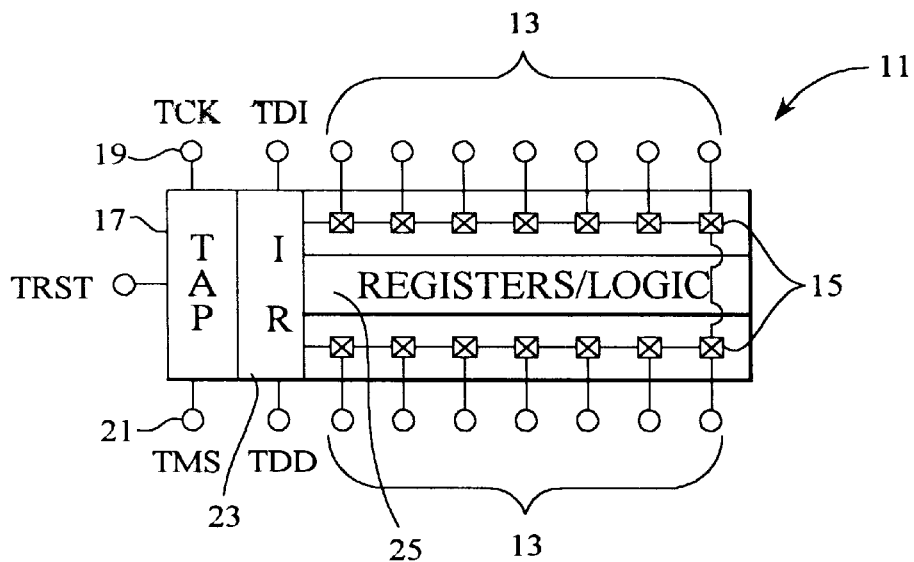
FIG. 1 is a plan view of an integrated circuit chip employing Boundary Scan test circuits, according to the prior art Boundary Scan standard, for testing the chip.

With reference to FIG. 1, an integrated circuit chip 11 is seen to have a plurality of functional pins 13 extending from both sides of the chip. These pins are used to execute all functions of the chip, including providing utility functions such as power supply functions and ground. Inward of the pins are boundary register cells 15 indicated by square rectangular blocks filled with the letter x. These cells can serve either as input or output boundary register cells. Each cell is a single shift register stage connected to an adjacent cell. In this manner, each cell is linked to other cells forming a boundary-scan register, shown in FIG. 3. When the boundary scan register is selected as a serial path between the TDI and TDO pins, boundary cell inputs and outputs, i.e., chip inputs and outputs, may be observed.

Returning to FIG. 1 a test access port (TAP) controller 17 is the heart of a boundary scan system. The TAP controller includes a state machine which is clocked at the TCK pin 19. IEEE Standard 1149.1 indicates that there shall be 16 states in the state machine of the TAP controller which operate as shown in the flow diagram of FIG. 2. Each state is shown in a block with a 0 or 1 indicating the signal on TMS pin 21 of TAP controller 17. TMS is an acronym for test mode select.

Figure 2:
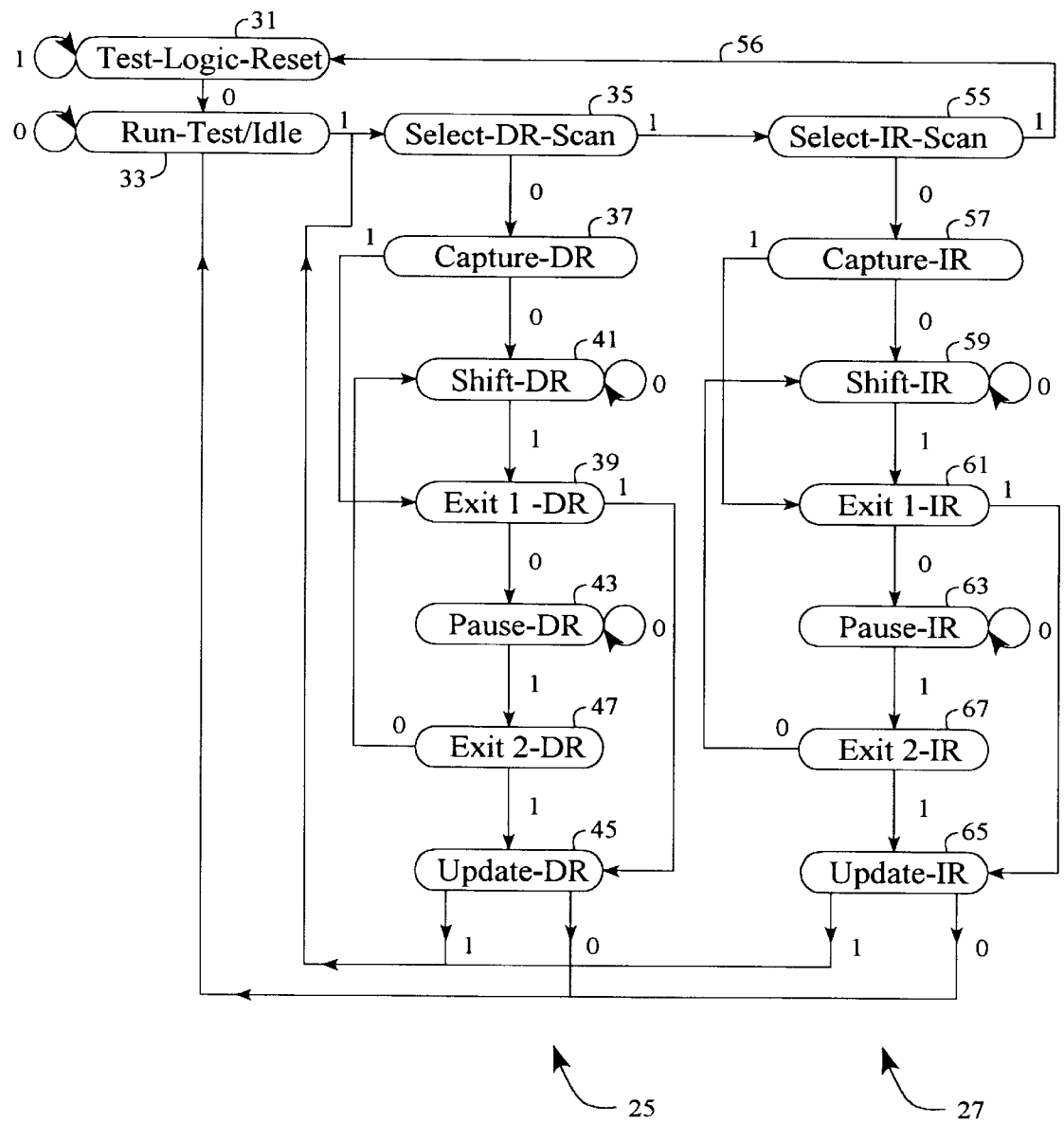
FIG. 2 is a TAP controller state diagram for prior art instruction sequencing of the present invention.

In FIG. 2, the column of blocks 25 is a data column, while the column of blocks 27 is an instruction column. The data column refers to a sequence of steps for data registers, labeled DR while the instruction column labels refer to a sequence of steps for an instruction register IR. Returning to FIG. 1, the instruction register 23 is shown to be immediately connected to the TAP controller 17, while the data registers 25 are seen to be removed from the TAP controller. The instruction register IR and the data registers DR will be more fully discussed with reference to FIG. 3.

Returning to FIG. 2, the upper lefthand block 31 is an initialization state which receives an input from TMS pin 21 in FIG. 1. In one mode, all test logic in registers 25 of FIG. 1 is disabled. In another mode RUN-TEST/IDLE block 33 is enabled. When triggered by the TMS pin, the controller steps to the SELECT-DR-SCAN state, indicated by the block 35. Block 35 triggers entry into the data column 25 or alternatively to the instruction column 27. On entry into the data column, the controller implements the CAPTURE-DR state, indicated by block 37, being a sequence for test data registers. With an alternative select signal, the SELECT-DR-SCAN block 35 can trigger action by instruction column 37 where there is a SELECT-IR-SCAN block 55 which moves into the CAPTURE-IR state block 57 where there can be a scan sequence for the instruction register. On the other hand, with another TMS signal, the controller can loop back to the TEST-LOGIC-RESET state indicated by block 31 by means of a signal transmitted along line 56. The CAPTURE-IR state requires that the instruction register 23 of FIG. 1 load a pattern of logic values for test purposes. Exit from the CAPTURE-IR block 57 is either to SHIFT-IR block 59 or to EXIT1-IR block 61 where there is a further branching to PAUSE-IR block 63 or, in another mode, to UPDATE-IR block 65. On the other hand, the PAUSE-IR block 63 can lead to EXIT2-IR block 67 which will loop back or proceed to UPDATE-IR block 65.

Returning to FIG. 2, the CAPTURE-DR block 37 loads a test data register selected by the current instruction in the instruction register. This leads either to EXIT1-DR block 39 or directly to SHIFT-DR block 41 where looping for a preset number of cycles may occur. The EXIT1-DR block 39 leads either to PAUSE-DR block 43 where looping for a predetermined number of clock cycles may occur or to UPDATE-DR block 45. When cycling through the PAUSE-DR state 43 is complete, the EXIT2-DR state 47 is entered, terminating the pause condition. From the EXIT2-DR state 47 the controller enters the UPDATE-DR state 45 or the SHIFT-DR state 41. The UPDATE-DR block allows data to be latched at the outputs of test data registers. The UPDATE-DR register provides a latched parallel output of the test data registers which normally shift data serially. The exit from this state is back to the RUN-TEST/IDLE state 35 or the SELECT-DR-SCAN state 35. The present invention works within the framework of the state transitions shown in FIG. 2.

Figure 3:
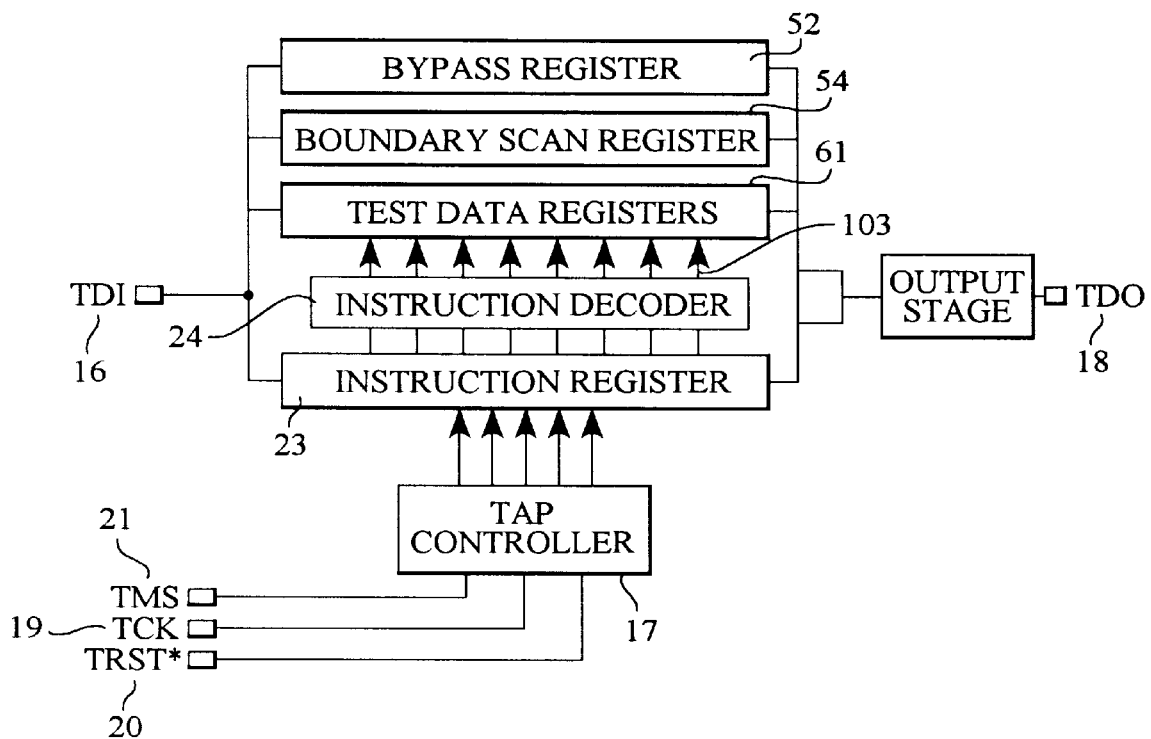
FIG. 3 is a block diagram of the test access port (TAP) and register configuration of a prior art Boundary Scan System to be used in the present invention.

With reference to FIG. 3, TAP controller 17 is shown to have dedicated input pins including the mode select TMS pin 21, the test clock pin 19 and the reset pin 20. The TAP controller 17 communicates with instruction register 23 executing the states discussed with reference to FIG. 2. The instruction register 23 communicates with instruction decoder 24 which provides mode selection outputs on lines 103 communicated to the various registers. Note that instruction register 23 resides between the test data input pin (TDI) 16 and the test data output pin (TDO) 18. A number of test data registers 61 are arranged in parallel between the TDI pin 16 and the TDO pin 18. These include the bypass register 52 and the boundary scan register 54. It will be remembered that the boundary scan register contains the boundary scan cells 15 shown in FIG. 1.

The prominent feature of the present invention is the design of additional instructions to supplement the standard set of JTAG instructions which can change the status of an integrated circuits on-chip system logic (OCSL). An example instruction list of one part of this invention is given as Table C.

TABLE C

| Instruction Name | Register | IR Code |
|---|---|---|
| Extest | Boundary Scan | 000 |
| Sample/Preload | Boundary Scan | 001 |
| Bypass | Bypass | 111 |
| StartOp | Any | 010 |
| StopOp | Any | 011 |

In Table C, instruction STARTOP begins a specific internal device function (or set of functions). This device function includes some modification to the OCSL's operation, changing it from a first condition to a second condition. Instruction STOPOP terminates the function, returning the OCSL to the first condition. The second condition may consist of some set of normal OCSL operating conditions, or it may be a test mode or any other OCSL operating condition that is not considered part of normal function. For example, this function may be a test mode, a reliability stress mode, a functional margin measurement, speed performance evaluation mode or an OCSL programming mode.

By including the STOPOP instruction, this invention allows a new alternative method of terminating the STARTOP function. In the absence of the STOPOP instruction, the prior art teaches that a function may be terminated by one of three options: (1) setting the TAP controller to the Test- Logic-Reset state, by any of the four methods noted above, (2) traversal of the TAP controller through the SHIFT-IR and UPDATE-IR states to select an standardized JTAG instruction, or (3) if the function operates in the same manner as the standardized RUNBIST instruction, execution terminates whenever the TAP controller leaves the Run-Test-Idle state.

Addition of the STOPOP instruction allows the IC to return to the first condition described above. The first condition may be such that it would not be possible to achieve the condition by starting from the Test-Logic-Reset state. For example, registers, that would normally be reset or loaded from on-chip memory in the Test-Logic-Reset state, may retain their present value through use of the STOPOP operation. Also, it may be the case that performing the STOPOP operation may, under some circumstances, return the IC to the same condition as performing a reset, but it may have the advantage of reaching the reset condition more quickly, thereby reducing operating time and cost. Also, the STOPOP may be used when data is entered into a Test Data Register other those that are accessed by the standardized instructions. The second option noted above for terminating a function would be prohibited in this case. Finally, the third option for terminating a function applies only if the STARTOP execution occurs while the TAP controller is in the Run-Test-Idle state, a restriction which is not necessarily placed upon the STARTOP instruction when the STOPOP instruction is used to terminate the function.

Another advantage of using a STOPOP instruction is that it allows the external test system to control the duration of the STARTOP instruction execution, independent of the specific number of clock cycles applied to the device or of the TAP controller state. In contrast, a RUNBIST instruction terminates whenever the TAP controller leaves the Run-Test-Idle state. Use of the STOPOP instruction to terminate STARTOP execution removes this restriction. This allows, for example, for the device to traverse to the UPDATE-DR and SHIFT-DR states and to examine the contents of the Test Data Register while the STARTOP instruction is still executing. This feature can be used to monitor the progress of the STARTOP operation while it is still executing. This feature also allows other devices in a common JTAG chain to freely traverse the TAP controller while one or more devices are executing the STARTOP instruction. This is not possible with a RUNBIST instruction, since the RUNBIST execution must terminate whenever the devices TAP controller is not in the Run-Test-Idle state, and since all IC's in a single JTAG chain (having common TCK and TMS signals and a daisy-chained TDI/TDO serial date path) are always in the same TAP controller state.

FIGS. 5, 6, and 7 show sample operation sequences for utilizing the STARTOP and STOPOP instructions. The TAP controller operates in the same manner as described for FIG. 2. In FIG. 5, the STOPOP instruction 89 is loaded into the instruction register and executed immediately after the STARTOP instruction 80. In FIG. 6, a Test Data Register is sampled in step 610 (Capture DR) and is shifted out in step 611 (Shift DR) while the STARTOP instruction 80 is being executed. This permits examination of the Test Data Register contents during STARTOP execution, possibly as a monitor of device functional operation, reliability, functional margin, or device speed performance.

In FIG. 7, a Test Data Register is sampled in step 715 (Capture DR) and shifted out in step 716 (Shift DR) during execution of the STOPOP instruction 89. This would allow, for example, investigation of the final results of the STARTOP operation. During STOPOP execution, OCSL operation may still be changed from normal operation as a result of the STARTOP, STOPOP execution sequence.

Another instruction which is implemented as a part of the present invention is shown in FIG. 10. In FIG. 10, the STOPOP instruction of FIG. 5, is replaced by a MODOP instruction 83. The MODOP instruction 83, when executed after the STARTOP instruction 80, modifies the OCSL's functionality, but does not return the OCSL to its condition prior to the STARTOP instruction execution. This allows the device to transition between different conditions: the condition before the STARTOP instruction, the condition during STARTOP execution, and the condition during MODOP execution. For additional flexibility, both the MODOP and STOPOP instructions may be included within a single devices instruction set. In this case, the STARTOP instruction may still be followed by the MODOP instruction and then the OCSL could then be made to return to the pre-STARTOP condition by subsequent execution of the STOPOP instruction. Addition of these interdependent instructions need not change the structure of the JTAG test logic circuitry. Changes need only be evident in the addition of new operating instructions and new or modified OCSL control (and possibly modified Boundary Scan Register and/or Test Data Register control) from the Instruction Register decoder.

Another embodiment of the present invention is the creation of instructions and attendant operating modes for which termination is self-timed within the integrated circuit. A minimum instruction set for this would be a single instruction, for example, an instruction named SELFTIMEDOP. FIG. 8 shows an instruction sequence using the SELFTIMEDOP instruction. Execution of this instruction begins when the Instruction Register is updated to the SELFTIMEDOP instruction 82. Termination of the instruction's execution occurs automatically after a period of time elapses, the period of time being determined by the IC. Also, termination of the SELFTIMEDOP instruction's execution may be designed to result in the OCSL status being different from that status that existed prior to SELFTIMEDOP execution.

Alternatively, for any of the new instructions described in this invention, instruction execution may be designed to begin only after the instruction is updated to the new instruction and the state machine has traversed to some other predefined state or set of states; for example, the Run-Test-Idle state. Further, instruction execution be may designed to begin only after the instruction is updated and the state machine has traversed to some other state or set of states defined at least partially by electrically configured data within the device and/or by the signal levels on external device pins. Further, instruction execution may begin on a state machine clock edge that does not produce a state transition. For example, if state transitions occur on the state clock's rising edge, instruction execution could begin on the clock's falling edge within any state.

Another part of this invention is instructions for which execution ends upon entry into a predefined state machine state or set of states, without changing the instruction register contents. FIG. 9 shows a flow diagram for an example where execution of the STARTOP instruction 80 may be designed to terminate whenever the state machine enters the Run-Test-Idle state 84. Further, instruction execution may be designed to end only after the state machine has traversed to some other state or set of states defined at least partially by electrically configured data within the device and/or by the signal levels on external device pins.

Alternatively, execution could stop in a state machine clock edge that does not produce a state transition. For example, if state transitions occur on the state clock's rising edge, instruction execution could be designed to terminate on the clock's falling edge with a predetermined state or set of states or by some other state or set of states defined at least partially by electrically configured data within the device and/or by the signal levels on external device pins. A minimum instruction set for such a device would be a single instruction.

What is claimed is:

1. A method for changing a state of an on-chip system logic (OCSL) of an integrated circuit comprising:

loading a set of instructions into an instruction register of a test access port state machine, the set of instructions including a minimum set of JTAG instructions and a set of supplemental instructions, wherein the set of supplemental instructions operates such that a particular instruction is designed to be executed in sequence after at least one previous instruction;

loading a start instruction from the set of supplemental instructions;

in response to the start instruction, initiating a function to modify the state of the OCSL from a first condition to a second condition;

loading a stop instruction from the set of supplemental instructions; and in response to the stop instruction, terminating the function and returning the state of the OCSL from the second condition to the first condition.

2. The method of claim 1, further comprising:

loading a modify instruction from the set of supplemental instructions;

in response to the modify instruction, changing the state of the OCSL from the second condition to a third condition.

3. The method of claim 1, further comprising:

loading a self-timed instruction from the set of supplemental instructions, in response to the self-timed instruction, initiating the function to modify the state of the OCSL from a first condition to a second condition, and further in response to the self-timed instruction, terminating the function after a predetermined period of time has elapsed and returning the state of the OCSL from the second condition to the first condition.

4. The method of claim 1, further comprising:

loading a predefined state instruction from the set of supplemental instructions, and in response to the predefined state instruction, initiating or terminating the function when the test access port state machine enters a predefined state.

5. The method of claim 1, further comprising:

loading a non-state transition instruction from the set of supplemental instructions, in response to the non-state transition instruction, initiating or terminating the function when a state machine clock edge has a state that does not produce a state transition.

6. A method for changing a state of an on-chip system logic (OCSL) of an integrated circuit comprising:

loading a set of instructions into an instruction register of a test access port state machine, the set of instructions including a minimum set of JTAG instructions and a set of supplemental instructions, wherein the set of supplemental instructions operates such that a particular instruction is designed to be executed in sequence after at least one previous instruction;

loading a start instruction from the set of supplemental instructions;

in response to the start instruction, initiating a function to modify the state of the OCSL from a first condition to a second condition;

loading a modify instruction from the set of supplemental instructions;

in response to the modify instruction, changing the state of the OCSL from the second condition to a third condition;

loading a stop instruction from the set of supplemental instructions;

in response to the stop instruction, terminating the function and returning the state of the OCSL from the third condition to the first condition.

7. The method of claim 6, further comprising:

loading a self-timed instruction from the set of supplemental instructions;

in response to the self-timed instruction, initiating the function to modify the state of the OCSL from a first condition to a second condition, and further in response to the self-timed instruction, terminating the function after a predetermined period of time has elapsed and returning the state of the OCSL from the second condition to the first condition.

8. The method of claim 6, further comprising:

loading a predefined state instruction from the set of supplemental instructions, and in response to the predefined state instruction, initiating or terminating the function when the test access port state machine enters a predefined state.

9. The method of claim 6, further comprising:

loading a non-state transition instruction from the set of supplemental instructions;

in response to the non-state transition instruction, initiating or terminating the function when a state machine clock edge has a state that does not produce a state transition.

10. A method for changing a state of an on-chip system logic (OCSL) of an integrated circuit comprising:

loading a set of instructions into an instruction register of a test access port state machine, the set of instructions including a minimum set of JTAG instructions and a set of supplemental instructions, wherein the set of supplemental instructions operates such that a particular instruction is designed to be executed in sequence after at least one previous instruction;

loading a self-timed instruction from the set of supplemental instructions, in response to the self-timed instruction, initiating the function to modify the state of the OCSL from a first condition to a second condition, and further in response to the self-timed instruction, terminating the function after a predetermined period of time has elapsed and returning the state of the OCSL from the second condition to the first condition.

* * * * *